(12) United States Patent
Nakamura et al.

(10) Patent No.: US 10,438,898 B2
(45) Date of Patent: Oct. 8, 2019

(54) WAFER PROCESSING METHOD

(71) Applicant: DISCO CORPORATION, Tokyo (JP)

(72) Inventors: Masaru Nakamura, Tokyo (JP);
Masamitsu Agari, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/819,673

(22) Filed: Nov. 21, 2017

(65) Prior Publication Data
US 2018/0151508 A1    May 31, 2018

(30) Foreign Application Priority Data
Nov. 28, 2016 (JP) .................. 2016-229963

(51) Int. Cl.
| | |
|---|---|
| *H01L 21/26* | (2006.01) |
| *H01L 23/544* | (2006.01) |
| *H01L 21/268* | (2006.01) |
| *H01L 21/304* | (2006.01) |
| *H01L 21/683* | (2006.01) |
| *H01L 21/78* | (2006.01) |

(Continued)

(52) U.S. Cl.
CPC .......... *H01L 23/544* (2013.01); *B24B 37/042* (2013.01); *H01L 21/268* (2013.01); *H01L 21/304* (2013.01); *H01L 21/6836* (2013.01); *H01L 21/78* (2013.01); *H01L 21/67092* (2013.01); *H01L 2221/6834* (2013.01); *H01L 2221/68327* (2013.01); *H01L 2223/5446* (2013.01)

(58) Field of Classification Search
CPC . H01L 23/544; H01L 21/304; H01L 21/6836; H01L 21/268; H01L 21/78; H01L 2223/5446; H01L 2223/68327; H01L 2221/6834
See application file for complete search history.

(56) References Cited

U.S. PATENT DOCUMENTS

| | | | |
|---|---|---|---|
| 2009/0170289 A1* | 7/2009 | Furuta ..................... | H01L 21/78 438/463 |
| 2012/0214278 A1* | 8/2012 | Nakata ................ | H01L 21/6836 438/113 |

(Continued)

FOREIGN PATENT DOCUMENTS

WO        WO/03077295 A1    9/2003

*Primary Examiner* — Charles D Garber
*Assistant Examiner* — S M Sohel Imtiaz
(74) *Attorney, Agent, or Firm* — Greer Burns & Crain, Ltd.

(57) ABSTRACT

A wafer processing method for processing a wafer has a front side and a back side, the front side of the wafer being formed with a plurality of crossing streets for defining a plurality of separate regions where a plurality of devices are individually formed. The wafer processing method includes the steps of first attaching a protective tape to the front side of the wafer, next heating the protective tape and the wafer, next applying a laser beam having a transmission wavelength to the wafer to the back side of the wafer along the streets, thereby forming a modified layer inside the wafer along each street, and next grinding the back side of the wafer, thereby reducing a thickness of the wafer to a predetermined thickness and also dividing the wafer into individual chips along each street where the modified layer is formed as a division start point.

2 Claims, 5 Drawing Sheets

(51) Int. Cl.
*B24B 37/04* (2012.01)
*H01L 21/67* (2006.01)

(56) References Cited

U.S. PATENT DOCUMENTS

| | | | |
|---|---|---|---|
| 2013/0183811 A1* | 7/2013 | Kobayashi | H01L 21/78 438/463 |
| 2014/0094019 A1* | 4/2014 | Furuta | H01L 21/78 438/463 |
| 2014/0206177 A1* | 7/2014 | Ogawa | H01L 21/78 438/462 |
| 2015/0038057 A1* | 2/2015 | Tamenori | H01L 21/6836 451/41 |

* cited by examiner

WAFER PROCESSING METHOD

BACKGROUND OF THE INVENTION

Field of the Invention

The present invention relates to a wafer processing method for processing a wafer having a plurality of devices on the front side.

Description of the Related Art

A plurality of devices are formed on the front side of a semiconductor wafer as a workpiece so as to be separated from each other by a plurality of crossing division lines called streets. The wafer thus having the devices is divided along the streets to obtain a plurality of individual device chips having the devices. These device chips divided from the wafer are used in various kinds of electronic equipment or the like.

As a method of dividing the wafer into the individual device chips, a processing method called stealth dicing before grinding (SDBG) is known. This processing method is a method using a laser processing apparatus capable of applying a laser beam to the wafer and a grinding apparatus having abrasive members capable of grinding the wafer (see PCT Patent Publication No. WO03/077295, for example). This processing method is a technique using laser processing and grinding in combination, wherein a laser beam having a transmission wavelength to the wafer is first applied to the wafer along the streets to thereby form a modified layer inside the wafer at a predetermined depth along each street, and the back side of the wafer is next ground to reduce the thickness of the wafer to a finished thickness and also to apply a grinding pressure to the wafer, thereby forming cracks extending from the modified layers as a division start point toward the front side of the wafer, so that the wafer can be divided into the individual device chips.

SUMMARY OF THE INVENTION

However, the processing method described in PCT Patent Publication No. WO03/077295 has the following problem. The plural chips to be formed by dividing the wafer are arranged adjacent to each other, so that there is no spacing between the corners of any diagonally adjacent ones of the plural chips. Accordingly, in grinding the wafer, the adjacent chips come into contact with each other and in particular the corners of the adjacent chips rub each other to cause chipping of the corners of each chip. When such chipping occurs, undesired cracks extend from the corners chipped toward the front side of each device, causing damage to each device.

It is therefore an object of the present invention to provide a wafer processing method using laser processing and grinding in combination, which can divide the wafer without the occurrence of chipping of the corners of each chip in grinding the wafer.

In accordance with an aspect of the present invention, there is provided a wafer processing method for processing a wafer having a front side and a back side, the front side of the wafer being formed with a plurality of crossing streets for defining a plurality of separate regions where a plurality of devices are individually formed. The wafer processing method includes a protective tape attaching step of attaching a protective tape to the front side of the wafer, a heating step of heating the protective tape and the wafer after performing the protective tape attaching step, a modified layer forming step of applying a laser beam having a transmission wavelength to the wafer to the back side of the wafer along the streets after performing the heating step, thereby forming a modified layer inside the wafer along each street, and a grinding step of grinding the back side of the wafer after performing the modified layer forming step, thereby reducing a thickness of the wafer to a predetermined thickness and also dividing the wafer into individual chips along each street where the modified layer is formed as a division start point.

Preferably, the plurality of streets are composed of a plurality of first streets extending in a first direction and a plurality of second streets extending in a second direction intersecting the first direction. The modified layer to be formed in the modified layer forming step includes a first modified layer extending along each first street and a second modified layer extending along each second street. The first modified layer is composed of a first group and a second group shifted from the first group in the second direction.

In the wafer processing method according to the present invention, the protective tape attaching step is first performed and the heating step is next performed to heat the protective tape and the wafer. The protective tape is composed of a base sheet and an adhesive layer formed on the base sheet, wherein the adhesive layer is adapted to stick to the front side of the wafer. Accordingly, the adhesive layer of the protective tape is softened by the heating step to thereby improve the adhesion of the protective tape to the front side of the wafer. As a result, in the grinding step, displacement of each chip can be suppressed, so that rubbing of the corners of the adjacent chips in the grinding step can be suppressed to thereby prevent chipping of the corners of each chip.

Furthermore, in the wafer processing method according to the present invention, the first modified layer is formed in the modified layer forming step in such a manner that the first modified layer extending along each first street in the first direction is composed of the first group and the second group, which are shifted from each other in the second direction, wherein the first modified layer in each of the first and second groups is discontinuously formed. With this arrangement, the corners of the diagonally adjacent chips can be spaced from each other. Accordingly, rubbing of the corners of the adjacent chips in the grinding step can be further suppressed to thereby further prevent chipping of the corners of each chip.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the wafer processing method according to the present invention will now be described with reference to the attached drawings. In this preferred embodiment, a wafer W shown in FIG. 1 is divided into individual device chips by the wafer processing method.

(1) Protective Tape Attaching Step

Figure 1:
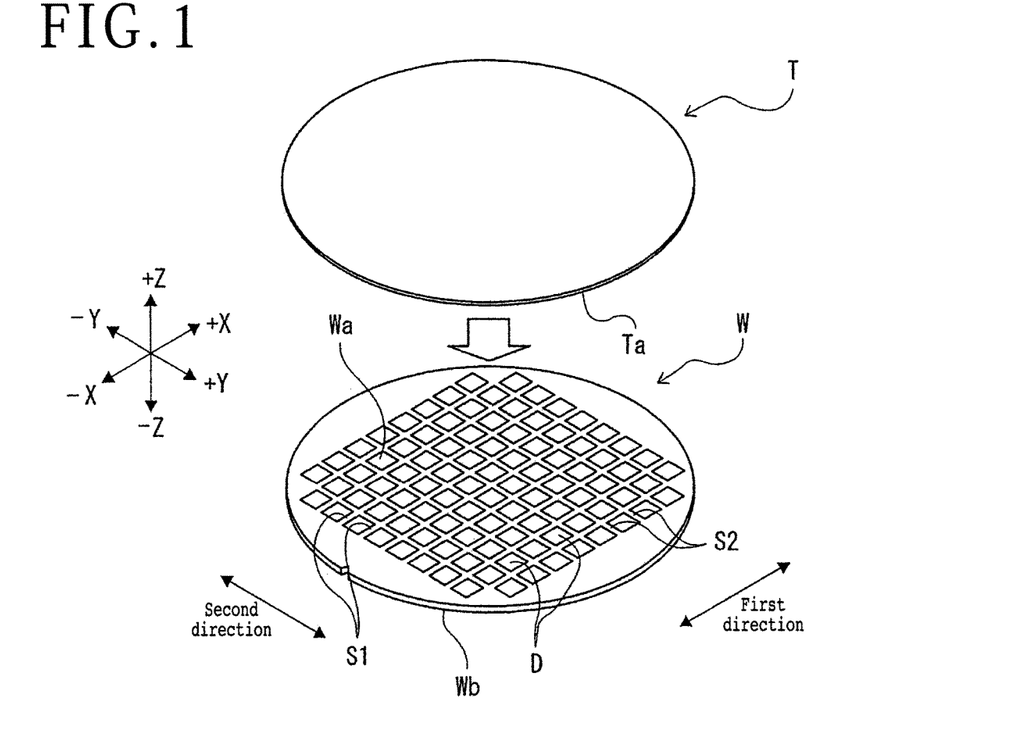
FIG. 1 is a perspective view showing a protective tape attaching step of attaching a protective tape to the front side of a wafer.

The wafer W as a workpiece shown in FIG. 1 is a disk-shaped semiconductor wafer, for example. The wafer W has a front side Wa and a back side Wb. A plurality of first streets S1 and a plurality of second streets S2 are formed on the front side Wa of the wafer W. The first streets S1 extend in a first direction, and the second streets S2 extend in a second direction perpendicular to the first direction in a horizontal plane. In FIG. 1, the first direction coincides with the X direction shown by arrows +X and −X, and the second direction coincides with the Y direction shown by arrows +Y and −Y. The first streets S1 are arranged at equal intervals, and the second streets S2 are also arranged at equal intervals. That is, the distance between the center lines of any adjacent ones of the first streets S1 is uniform, and the distance between the center lines of any adjacent ones of the second streets S2 is also uniform. The first streets S1 and the second streets S2 intersect each other to define a plurality of rectangular separate regions where a plurality of devices D such as integrated circuits (ICs) are individually formed.

A protective tape attaching step is first performed to attach a protective tape T to the front side Wa of the wafer, thereby protecting the front side Wa as shown in FIG. 1. For example, the protective tape T is a circular film having substantially the same diameter as that of the wafer W. The protective tape T is composed of a base sheet and an adhesive layer formed on the base sheet. The base sheet is formed of polyolefin, for example, and the adhesive layer is formed of a paste material. The adhesive layer has an adhesive surface Ta capable of sticking to the front side Wa of the wafer W. In the condition where the center of the protective tape T is set so as to substantially coincide with the center of the wafer W, the adhesive surface Ta of the adhesive layer of the protective tape T is attached to the front side Wa of the wafer W. Accordingly, the front side Wa of the wafer W is protected by the protective tape T.

(2) Heating Step

Figure 2:
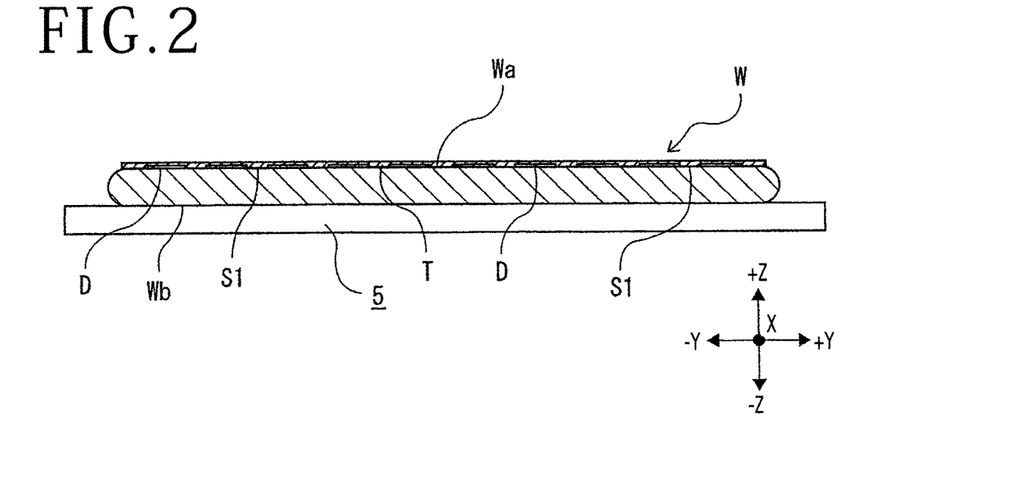
FIG. 2 is a sectional view showing a heating step of heating the protective tape and the wafer on a hot plate.

After performing the protective tape attaching step, a heating step is performed to heat the protective tape T and the wafer W, thereby softening the adhesive layer of the protective tape T to improve the adhesion of the protective tape T to the front side Wa of the wafer W. As shown in FIG. 2, a hot plate 5 is used to heat the protective tape T and the wafer W. More specifically, the hot plate 5 is previously heated to a predetermined temperature, and the wafer W with the protective tape is placed on the hot plate 5 in the condition where the back side Wb of the wafer W is in contact with the hot plate 5 as shown in FIG. 2. The temperature of the hot plate 5 is suitably set in the range of approximately 50° C. to approximately 90° C., depending on the kinds of the adhesive layer and the base sheet of the protective tape T and the thickness of the protective tape T, for example. In the case that the base sheet of the protective tape T is formed of polyolefin as in this preferred embodiment, the temperature of the hot plate 5 is set to approximately 70° C. The temperature of the hot plate 5 is set to a temperature at which the protective tape T is not melted and the diameter of the protective tape T does not change due to heat shrinkage of the protective tape T.

While the wafer W with the protective tape T is placed on the hot plate 5 in the condition where the back side Wb of the wafer W is in contact with the hot plate 5, the condition in heating the protective tape T and the wafer W is not limited to the above. For example, the wafer W with the protective tape T may be placed on the hot plate 5 in the condition where the protective tape T is in contact with the hot plate 5 in performing the heating step. In this case, the protective tape T can be heated more quickly.

In the case that the protective tape attaching step and the heating step are performed simultaneously, the protective tape T is heated and attached to the wafer W in the condition where the protective tape T is expanded in the radially outward direction. Accordingly, the protective tape attached to the wafer W has a residual stress so as to contract. As a result, when a predetermined period of time has elapsed after attaching the protective tape T to the wafer W and the protective tape T is therefore cooled, a contraction force of restoring the natural length of the protective tape T propagates as a mechanical external force to the front side Wa of the wafer W, causing a problem such that undue tension is applied to the front side Wa of the wafer W. To the contrary, the wafer processing method according to the present invention includes the protective tape attaching step and the heating step to be performed in this order. That is, the heating step of heating the protective tape T and the wafer W is performed after performing the protective tape attaching step. Accordingly, the above problem can be prevented.

After the wafer W is placed on the hot plate 5 for approximately five minutes, for example, the heating of the protective tape T and the wafer W is completed. By heating the protective tape T, the adhesive layer of the protective tape T is softened to thereby improve the adhesion of the protective tape T to the front side Wa of the wafer W. The duration of heating of the protective tape T and the wafer W is preferably set to approximately five minutes to approximately ten minutes. Further, while the protective tape T and the wafer W are heated by using the hot plate 5 in a contact manner in this preferred embodiment, they may be heated in a noncontact manner by using an infrared lamp or a heating oven capable of radiating infrared light, for example.

(3) Modified Layer Forming Step

After performing the heating step, a modified layer forming step is performed by applying a laser beam having a transmission wavelength to the wafer W to thereby form a modified layer inside the wafer W. This modified layer forming step is performed by using a laser processing apparatus 1 shown in FIG. 3. The laser processing apparatus 1 includes a chuck table 10 for holding the wafer W under suction and laser beam applying means 11 for applying a laser beam to the wafer W held on the chuck table 10. The chuck table 10 is circular in outside shape and has a holding surface 10a formed of a porous material for holding the wafer W under suction. The chuck table 10 is rotatable about its axis extending in a vertical direction (Z direction shown arrows +Z and −Z in FIG. 3) and also movable in the X direction (+X direction and −X direction) by feeding means 12.

Figure 3:
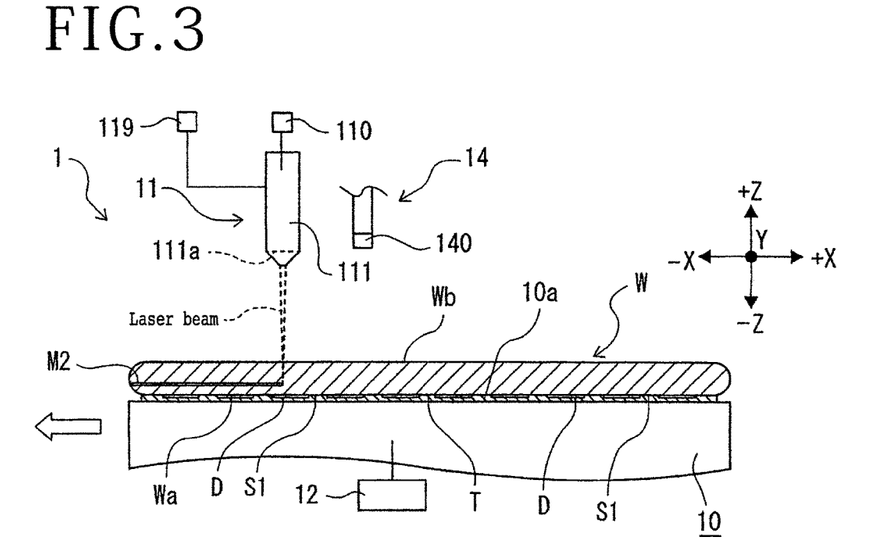
FIG. 3 is a sectional view showing a modified layer forming step of applying a laser beam to the wafer by using a laser processing apparatus, wherein a second modified layer is formed inside the wafer along each second street extending in a second direction.

The laser beam applying means 11 includes a laser oscillator 110 (e.g., yttrium aluminum garnet (YAG) laser or yttrium orthovanadate (YVO4) laser) for oscillating a laser beam having a transmission wavelength to the wafer W. The laser oscillator 110 is connected through an optical transmitting system such as an optical fiber to focusing means 11 having a focusing lens 111a. Accordingly, the laser beam oscillated from the laser oscillator 110 can be transmitted through the optical transmitting system to the focusing means 111 and then focused inside the wafer W by the focusing lens 111a. The laser processing apparatus 1 further includes ON/OFF switching means 119 for switching between the start and the stop of the operation of the laser oscillator 110, i.e., switching between ON and OFF of the application of the laser beam by the laser oscillator 110.

Alignment means 14 for detecting the first streets S1 and the second streets S2 of the wafer W shown in FIG. 1 is provided in the vicinity of the laser beam applying means 11. The alignment means 14 includes infrared light applying means (not shown) for applying infrared light and an infrared camera 140 including an optical system for capturing the infrared light and an imaging device (infrared charge-coupled device (CCD)) for outputting an electrical signal corresponding to the infrared light. According to an image obtained by the infrared camera 140, the alignment means 14 performs image processing such as pattern matching to thereby detect the first streets S1 and the second streets S2 formed on the front side Wa of the wafer W. The alignment means 14 and the laser beam applying means 11 are integrated in configuration, and both are movable together in the Y direction and in the Z direction. All of the chuck table 10, the laser beam applying means 11, the feeding means 12, and the alignment means 14 are connected to control means (not shown) for generally controlling the laser processing apparatus 1. The control means is composed mainly of a central processing unit (CPU) and a storage device such as a memory. The control means functions to control the operation of each component mentioned above according to processing conditions input from an operator to the control means.

In performing the modified layer forming step by using the laser processing apparatus 1 shown in FIG. 3, the laser beam is first applied along the second streets S2 to form a plurality of second modified layers inside the wafer W along the second streets S2. Thereafter, the laser beam is applied along the first streets S1 to form a plurality of first modified layers inside the wafer W along the first streets S1. Each second modified layer is formed continuously and linearly along the center line of each second street S2, whereas each first modified layer is formed discontinuously so as to be arranged in a zigzag manner on the opposite sides with respect to the center line of each first street S1. Prior to forming the second modified layers and the first modified layers, the operator sets and input processing conditions into the control means (not shown) included in the laser processing apparatus 1. For example, the processing conditions to be preset include the feed speed, of the wafer W, the processing start positions of the first streets S1 and the second streets S2, the pitch of the first streets S1, and the pitch of the second streets S2. The feed speed of the wafer W is input by the operator from input means (not shown) included in the laser processing apparatus 1. The processing start positions of the first streets S1 and the second streets S2 are detected by the alignment means 14. The pitch of the first streets S1 and the pitch of the second streets S2 are known values, so that these values are input by the operator from the input means (not shown) included in the laser processing apparatus 1. Further, to make discontinuous the first modified layer to be formed along each first street S1, an ON time and an OFF time to be switched by the ON/OFF switching means 119 are decided and set into the control means. The ON time and the OFF time are calculated by the control means according to the pitch of the second streets S2 and the feed speed of the wafer W. The ON time and the OFF time are equal to each other, and each time is defined as the time to be taken by the chuck table 10 in traveling a distance corresponding to the pitch of the second streets S2 in the X direction. The ON time and the OFF time are alternately repeated.

The modified layer forming step is performed in the following manner. First, the wafer W is positioned so that the protective tape T attached to the front side Wa of the wafer W is opposed to the holding surface 10a of the chuck table 10 in the laser processing apparatus 1 shown in FIG. 3. Further, the wafer W with the protective tape T is placed on the chuck table 10 in the condition where the back side Wb of the wafer W is oriented upward. Thereafter, a vacuum source (not shown) connected to the chuck table 10 is operated to hold the wafer W on the chuck table 10 under suction.

Thereafter, an alignment operation is performed in the following manner. The chuck table 10 holding the wafer W is rotated about its axis extending in the Z direction, so as to make the first streets S1 of the wafer W parallel to the X direction. Thereafter, the feeding means 12 is operated to move the wafer W held on the chuck table 10 in the −X direction (forward direction), and the first streets S1 are detected by the alignment means 14. Although the front side Wa of the wafer W on which the first streets S1 are formed is oriented downward and it is not directly opposed to the alignment means 14, the first streets S1 can be imaged by the infrared camera 140 from the back side Wb of the wafer W through the thickness thereof. According to the image of the first streets S1 obtained by the infrared camera 140, the alignment means 14 performs image processing such as pattern matching to thereby detect the position of a target one of the first streets S1 where the laser beam is to be first applied, e.g., the position of the leftmost one of the first streets S1 on the −Y side as viewed in FIG. 2. Then, the Y coordinate of this target first street S1 detected above is stored into the control means.

Thereafter, the chuck table 10 holding the wafer W is rotated about its axis extending in the Z direction, so as to make the second streets S2 of the wafer W parallel to the X direction. Thereafter, the second streets S2 are detected by the alignment means 14. For example, the leftmost one of the second streets S2 on the −X side as viewed in FIG. 1 is detected.

In association with the detection of the target second street S2, the laser beam applying means 11 is moved in the Y direction to align the focusing means 111 with the target second street S2 along which the laser beam is to be applied. Thus, the alignment between the focusing means 111 and the target second street S2 is performed in the Y direction. This alignment is performed in such a manner that the center line of the target second street S2 is positioned directly below the focusing lens 111a included in the focusing means 111.

Thereafter, the focusing means 111 is vertically moved to set the focal point of the laser beam having a transmission wavelength to the wafer W inside the wafer W at a predetermined height from the front side Wa above the target second street S2. In this condition, the laser beam oscillated from the laser oscillator 110 and focused by the focusing lens 111a is applied along the target second street S2 as moving the wafer W in the −X direction at a predetermined feed speed, thereby forming a second modified layer M2 inside the wafer W along the target second street S2 as shown in FIG. 3. The vertical position where the second modified layer M2 is to be formed inside the wafer W in the thickness direction (Z direction) thereof is set above a predetermined height from the front side Wa of the wafer W, which height corresponds to the finished thickness of each device chip. The second modified layer M2 is formed so as to be superimposed on the center line of the target second street S2 extending in the second direction as viewed in plan.

Figure 4:
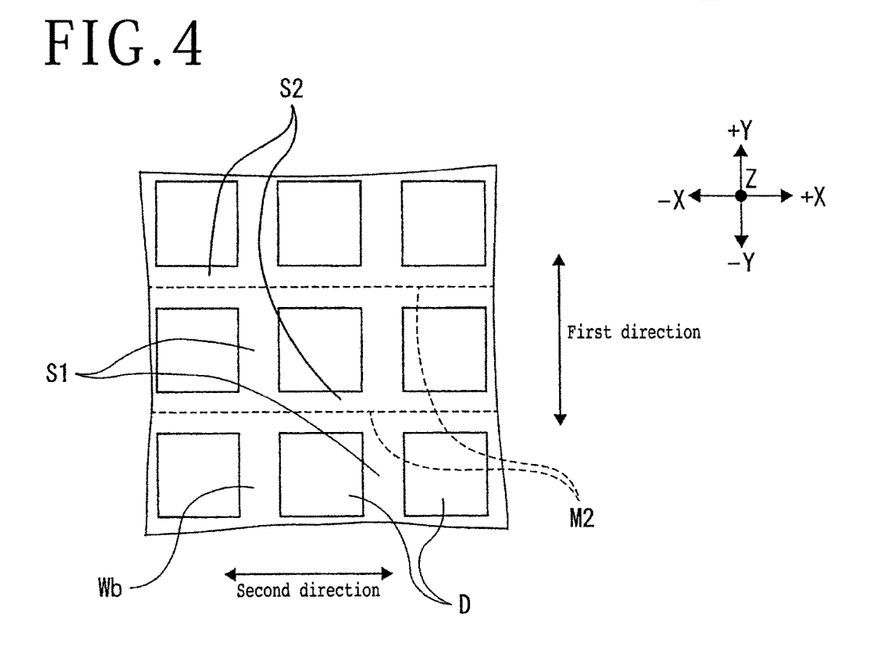
FIG. 4 is a plan view showing an essential part of the wafer in the condition where the second modified layer extends linearly and continuously along each second street.

Thus, the second modified layer M2 is continuously formed inside the wafer W along the center line of the target second street S2. When the wafer W is fed in the −X direction to reach a predetermined position in the X direction, the application of the laser beam is once stopped. As a result, the second modified layer M2 is formed linearly and continuously along the target second street S2 inside the wafer W as shown by a broken line in FIG. 4, wherein the second modified layer M2 extends from one end of the target second street S2 to the other end thereof so as to cross all the first streets S1.

In this manner, the application of the laser beam is once stopped at the other end of the target second street S2, and the feeding of the wafer W in the −X direction (forward direction) is also once stopped. Thereafter, the laser beam applying means 11 is moved in the +Y direction so that the focusing means 111 is aligned with the next second street S2 adjacent to the above target second street S2 where the second modified layer M2 has already been formed. Thereafter, the feeding means 12 is operated to feed the wafer W in the +X direction (backward direction), and the laser beam is applied again to the wafer W along this next second street S2, thereby forming a similar second modified layer M2 along this next second street S2. Thereafter, the laser beam is similarly applied to the back side Wb of the wafer W along all of the other second streets S2 extending in the X direction, thereby forming a plurality of second modified layers M2 inside the wafer W along all the other second streets S2, wherein each second modified layer M2 functions as a division start point where the wafer W starts to be divided.

Thereafter, the laser beam having a transmission wavelength to the wafer W is applied along the first streets S1 to thereby form a plurality of first modified layers extending in the first direction inside the wafer W in the following manner. First, the chuck table 10 holding the wafer W is rotated 90 degrees about its axis extending in the Z direction to make the first streets S1 of the wafer W parallel to the X direction. Thereafter, the feeding means 12 is operated to move the wafer W held on the chuck table 10 in the −X direction (forward direction).

Figure 5:
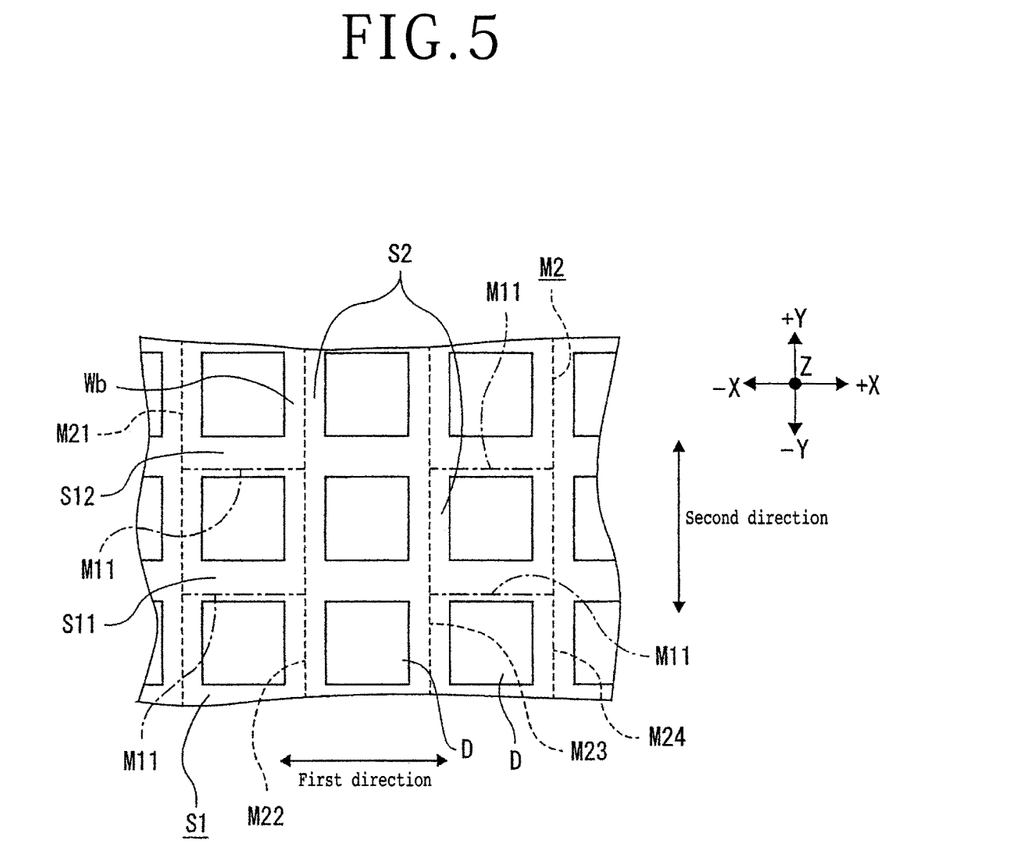
FIG. 5 is a plan view similar to FIG. 4, showing a condition that a first modified layer is discontinuously formed along each first street extending in a first direction perpendicular to the second direction.

Thereafter, the position of the focusing means 111 in the Y direction is set above a target first street S11 shown in FIG. 5 where the laser beam is to be first applied. This positioning is performed in such a manner that the position directly below the focusing lens 111a included in the focusing means 111 is shifted from the center line of the target first street S11 in the −Y direction by a predetermined distance.

Thereafter, the focusing means 111 is vertically moved to set the focal point of the laser beam having a transmission wavelength to the wafer W inside the wafer W at a predetermined height from the front side Wa above the target first street S11. In this condition, the laser beam oscillated from the laser oscillator 110 and focused by the focusing lens 111a is applied along the target first street S11 as moving the wafer W in the −X direction at a predetermined feed speed, thereby forming a first modified layer M11 inside the wafer W along the target first street S11 as shown by a single dot-and-dash line in FIG. 5. The vertical position where the first modified layer M11 is to be formed inside the wafer W in the thickness direction (Z direction) thereof is set above a predetermined height from the front side Wa of the wafer W, which height corresponds to the finished thickness of each device chip. Further, the first modified layer M11 is formed so as to be shifted from the center line of the target first street S11 in the −Y direction by a predetermined distance.

More specifically, as shown in FIG. 5, the wafer W is fed by the distance between the center lines of any adjacent ones of the second streets S2 (i.e., by the pitch of the second streets S2), and during this time the first modified layer M11 is formed so as to extend linearly from the second modified layer M21 to the second modified layer M22 adjacent thereto, wherein the two adjacent second modified layers M21 and M22 are spaced from each other by the above distance in the first direction. When the first modified layer M11 is formed between the two adjacent second modified layers M21 and M22, the control means determines that the ON time of the laser oscillator 110 has elapsed and then controls the ON/OFF switching means 119 to switch the application of the laser beam to the OFF condition. As a result, the laser beam is not applied between the second modified layer M22 and the second modified layer M23 adjacent thereto, wherein the two adjacent second modified layers M22 and M23 are spaced from each other by the above distance in the first direction. During this OFF time, the wafer W continues to be moved in the −X direction at the predetermined feed speed, so that the first modified layer M11 is not formed between the two adjacent second modified layers M22 and M23 as shown in FIG. 5.

Thus, the wafer W is fed in the −X direction at the predetermined feed speed by the distance between the center lines of the two adjacent second streets S2 during this OFF time. When this OFF time has elapsed, the ON/OFF switching means 119 is operated again to switch the application of the laser beam to the ON condition. As a result, the laser beam is applied again between the second modified layer M23 and the second modified layer M24 adjacent thereto, wherein the two adjacent second modified layers M23 and M24 are spaced from each other by the above distance in the first direction. During this ON time, the wafer W continues to be moved in the −X direction at the predetermined feed speed, so that the first modified layer M11 is formed between the two adjacent second modified layers M23 and M24 as shown in FIG. 5.

In this manner, the first modified layer M11 is discontinuously formed inside the wafer W along the first street S11 so as to be separated by the predetermined spacing in the first direction. When the wafer W is fed in the −X direction to reach the other end of the first street S11, the application of the laser beam is once stopped and the feeding of the wafer W in the −X direction (forward direction) is also once stopped. Thereafter, the laser beam applying means 11 is moved in the +Y direction so that the focusing means 111 is aligned with the next first street S12 adjacent to the first street S11 where the first modified layer M11 has already been formed. Thereafter, the feeding means 12 is operated to feed the wafer W in the +X direction (backward direction), and the laser beam is applied again to the wafer W along this next first street S12, thereby forming a similar first modified layer M11 along this next first street S12. Thereafter, the laser beam is similarly applied to the back side Wb of the wafer W along all of the other first streets S1 extending in the X direction, thereby forming a plurality of first modified layers M11 inside the wafer W along all the other first streets S1, wherein each first modified layer M11 functions as a division start point where the wafer W starts to be divided.

Thereafter, the laser beam having a transmission wavelength to the wafer W is applied again along the first streets S1 to thereby form a plurality of first modified layers extending in the first direction inside the wafer in the following manner, wherein the first modified layers to be formed are shifted from the first modified layers M11 in the second direction. First, the feeding means 12 is operated to move the wafer W held on the chuck table 10 in the −X direction (forward direction).

Thereafter, the position of the focusing means 111 in the Y direction is set above the first streets S11 where the laser beam is to be first applied. This positioning is performed in such a manner that the position directly below the focusing lens 111*a* included in the focusing means 111 is shifted from the center line of the target first street S11 in the +Y direction by a predetermined distance. Thereafter, the focusing means 111 is vertically moved to set the focal point of the laser beam having a transmission wavelength to the wafer W at a predetermined height from the front side Wa above the target first street S11. Further, the wafer W is moved in the −X direction at a predetermined feed speed.

Figure 6:
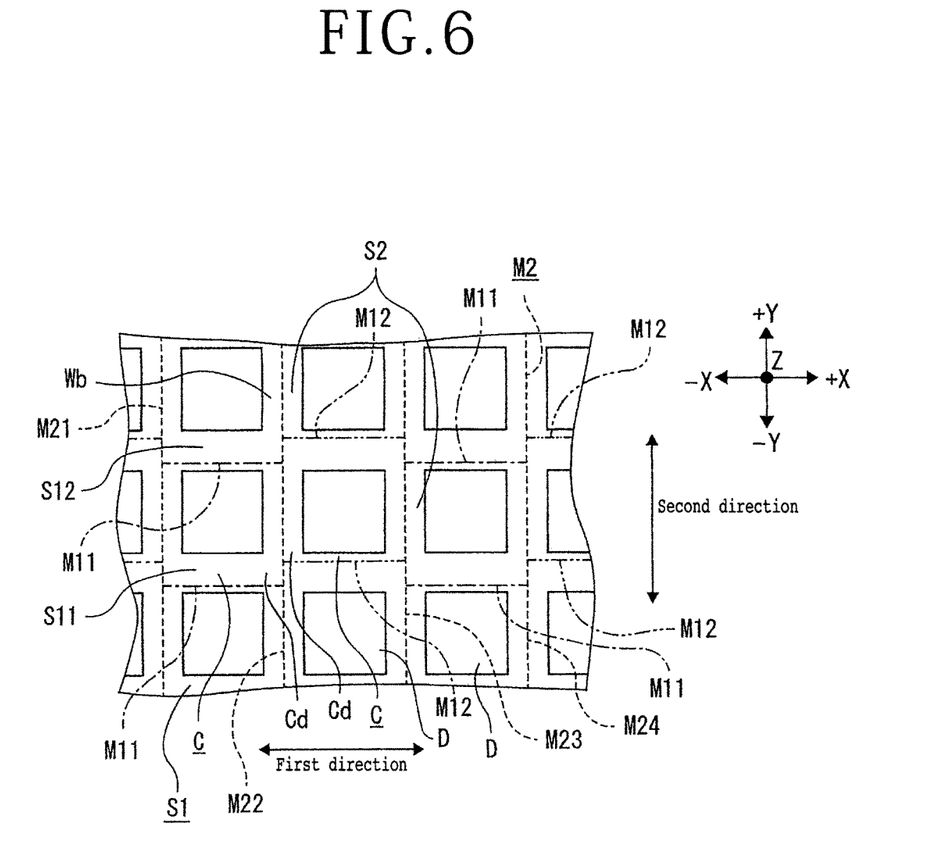
FIG. 6 is a plan view similar to FIG. 5, showing a condition that another first modified layer is discontinuously formed along each first street so as to be shifted from the previously formed first modified layer in the second direction.

When the ON/OFF switching means 119 is operated to switch the application of the laser beam to the OFF condition, the laser beam is not applied between the second modified layer M21 and the second modified layer M22 shown in FIG. 6 while the wafer W is being fed in the −X direction, so that no first modified layer is formed between the two adjacent second modified layers M21 and M22.

When the wafer W is fed by the distance between the center lines of any adjacent ones of the second streets S2 during the OFF time of the laser oscillator 110, the laser beam is not applied during this OFF time. When this OFF time has elapsed, the ON/OFF switching means 119 is operated to switch the application of the laser beam to the ON condition. Accordingly, the laser beam is applied during the next ON time while the wafer W is next being fed by the above distance, so that a first modified layer M12 shown by a double dot-and-dash line in FIG. 6 is formed between the second modified layer M22 and the second modified layer M23 adjacent thereto. The vertical position where the first modified layer M12 is to be formed inside the wafer W in the thickness direction (Z direction thereof is set above a predetermined height from the front side Wa of the wafer W, which height corresponds to the finished thickness of each device chip. Further, the first modified layer M12 is formed so as to be shifted from the center line of the target first street S11 in the +Y direction by a predetermined distance. As a result, the first modified layer M12 is formed so as to be shifted from the first modified layer M11 in the second direction.

More specifically, as shown in FIG. 6, the wafer W is fed by the distance between the center lines of any adjacent ones of the second streets S2, and during this time the first modified layer M12 is formed so as to extend linearly from the second modified layer M22 to the second modified layer M23 adjacent thereto. After the first modified layer M12 is formed between the two adjacent second modified layers M22 and M23, the ON/OFF switching means 119 is operated to switch the application of the laser beam to the OFF condition. As a result, the laser beam is not applied between the second modified layer M23 and the second modified layer M24 adjacent thereto. During this OFF time, the wafer W continues to be moved in the −X direction at the predetermined feed speed, so that the first modified layer M12 is not formed between the two adjacent second modified layers M23 and M24 as shown in FIG. 6.

In this manner, the first modified layer M12 is discontinuously formed inside the wafer W along the first street S11 so as to be separated by the predetermined spacing in the first direction. When the wafer W is fed in the −X direction to reach the other end of the first street S11, the application of the laser beam is once stopped and the feeding of the wafer W in the −X direction (forward direction) is also once stopped. Thereafter, the laser beam applying means 11 is moved in the +Y direction so that the focusing means 111 is aligned with the next first street S12 adjacent to the first street S11 where the first modified layer M12 has already been formed. Thereafter, the feeding means 12 is operated to feed the wafer W in the +X direction (backward direction), and the laser beam is applied again to the wafer W along this next first street S12, thereby forming a similar first modified layer M12 along this next first street S12. Thereafter, the laser beam is similarly applied to the back side Wb of the wafer W along all of the other first streets S1 extending in the X direction, thereby forming a plurality of first modified layers M12 inside the wafer W along all the other first streets S1, wherein each first modified layer M12 functions as a division start point where the wafer W starts to be divided. As described above, the first modified layers M12 extend in the first direction so as to be shifted from the first modified layers M11 in the second direction, wherein each first modified layer M12 is discontinuously formed inside the wafer W along each first street S1. Each first modified layer M12 is formed at the X coordinate positions where the laser beam is not applied (OFF time) in forming the first modified layer M11. Accordingly, along each first street S11, 12, . . . , the first modified layer M11 and the first modified layer M12 are alternately formed so as to be shifted from each other in the second direction. In other words, the first modified layers M11 and M12 extending along each first street S11, 12, . . . are arranged in a zigzag manner on the opposite sides with respect to the center line of each first street S11, 12, . . . .

(4) Grinding Step

Figure 7:
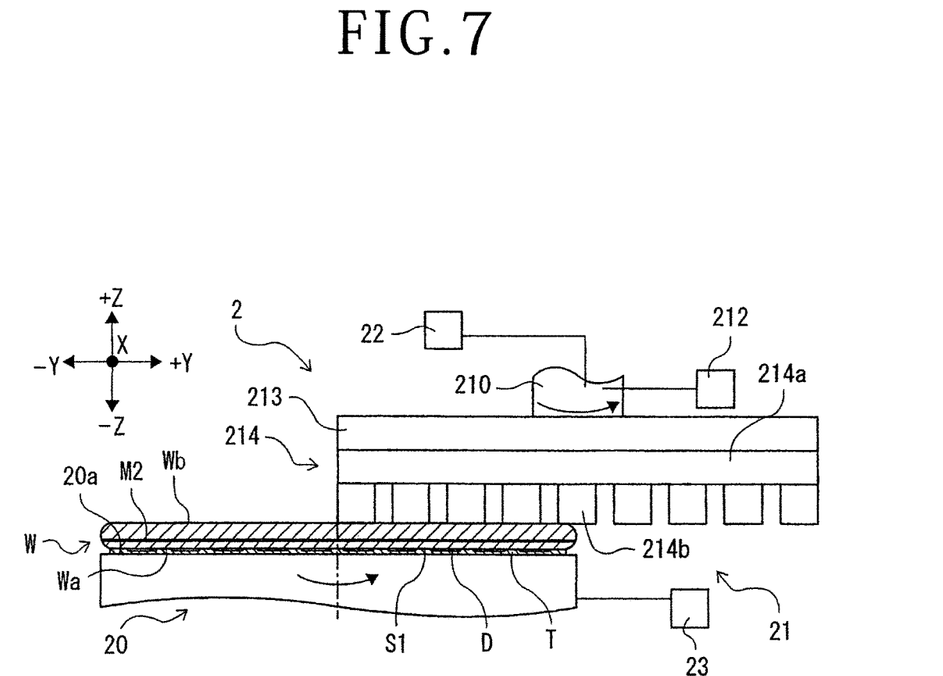
FIG. 7 is a sectional view showing a grinding step of grinding the back side of the wafer to thereby reduce the thickness of the wafer to a predetermined thickness and also to divide the wafer into individual chips along the first modified layer and the second modified layer functioning as a division start point.

After performing the modified layer forming step, a grinding step is performed by using a grinding apparatus 2 shown in FIG. 7 to grind the back side Wb of the wafer W, thereby reducing the thickness of the wafer W to a predetermined thickness and also dividing the wafer W into individual chips C shown in FIG. 6 along the first modified layers M11 and M12 and the second modified layers M2 shown in FIG. 6 as a division start point.

The grinding apparatus 2 shown in FIG. 7 includes a holding table 20 for holding the wafer W under suction and grinding means 21 for grinding the wafer W held on the holding table 20. The holding table 20 is circular in outside shape and has a holding surface 20*a* formed of a porous material for holding the wafer W under suction. The holding table 20 is rotatable about its axis extending in a vertical direction (Z direction) and also movable in the Y direction (+Y direction and −Y direction) by Y moving means 23.

The grinding means 21 is vertically movable in the Z direction (+Z direction and −Z direction) by feeding means 22. That is, by operating the feeding means 22, the grinding means 21 is moved toward or away from the holding surface 20a of the holding table 20. The feeding means 22 may be provided by a ball screw mechanism adapted to be operated by a motor or the like. The grinding means 21 includes a spindle 210 rotatable about its axis extending in a vertical direction (Z direction), a motor 212 for rotating the spindle 210, a circular mount 213 connected to the lower end of the spindle 210, and an annular grinding wheel 214 detachably mounted on the lower surface of the mount 213.

The grinding wheel 214 is composed of an annular wheel base 214a and a plurality of abrasive members 214b fixed to the lower surface of the wheel base 214a so as to be arranged annularly along the outer circumference of the wheel base 214a, wherein each abrasive member 214b has a substantially rectangular prismatic shape. Each abrasive member 214b is formed by bonding diamond abrasive grains with a resin bond or a metal bond, for example. While the plural abrasive members 214b are used in this preferred embodiment, an annular single abrasive member may be used.

A grinding water passage (not shown) is formed in the spindle 210 so as to extend in the axial direction (Z direction) of the spindle 210. The grinding water passage is connected at an upper end thereof to a grinding water source (not shown). The grinding water passage extends through the mount 213 and the lower end of the grinding water passage opens to the lower surface of the wheel base 214a so as to discharge a grinding water toward the abrasive members 214b.

In performing the grinding step, the wafer W is placed on the holding surface 20a of the holding table 20 in the condition where the back side Wb of the wafer W is oriented upward. At this time, the center of the wafer W is set so as to substantially coincide with the center of the holding table 20. Thereafter, a vacuum source (not shown) connected to the holding surface 20a is operated to produce a suction force, which is transmitted to the holding surface 20a, thereby holding the wafer W on the holding surface 20a under suction.

Thereafter, the holding table 20 holding the wafer W is moved in the +Y direction to the position below the grinding means 21. Further, the wafer W is preset in position relative to the grinding wheel 214 of the grinding means 21 in the Y direction. This positioning is performed in such a manner that the center of rotation of the grinding wheel 214 is shifted from the center of rotation of the holding table 20 in the +Y direction by a predetermined distance and the locus of rotation of the abrasive members 214b passes through the center of rotation of the holding table 20 as viewed in plan.

Thereafter, the motor 212 is operated to rotate the spindle 210 in the counterclockwise direction as viewed from the +Z side, thereby rotating the grinding wheel 214 in the same direction. Further, the feeding means 22 is operated to feed the grinding means 21 in the −Z direction so that the abrasive members 214b of the grinding wheel 214 being rotated abut against the back side Wb of the wafer W, thereby grinding the back side Wb of the wafer W. During this grinding operation, the holding table 20 is also rotated in the counterclockwise direction as viewed from the +Z side, so that the whole surface of the back side Wb of the wafer W is ground by the abrasive members 214b. Further, during this grinding operation, the grinding water is supplied from the grinding water source (not shown) through the grinding water passage (not shown) formed in the spindle 210 to a position where the abrasive members 214b come into contact with the back side Wb of the wafer W, thereby cooling and cleaning the contact position between the abrasive members 214b and the wafer W.

By performing this grinding operation, a grinding pressure is applied to the wafer W along the first modified layers M11 and M12 and the second modified layers M2 shown in FIG. 6, so that cracks extend from these modified layers M11, M12, and M2 toward the front side Wa of the wafer W, thereby dividing the wafer W into the individual rectangular chips C individually having the devices D shown in FIG. 6. After dividing the wafer W into the chips C, the grinding operation is continued to further reduce the thickness of the wafer W to the finished thickness of each chip C. Thereafter, the feeding means 22 is operated to raise the grinding means 21 in the +Z direction, and the grinding operation is finished.

In the wafer processing method according to the present invention, the protective tape attaching step is first performed and the heating step is next performed to heat the protective tape T and the wafer W. Accordingly, the adhesive layer of the protective tape T is softened by the heating step to thereby improve the adhesion of the protective tape T to the front side Wa of the wafer W. As a result, in the grinding step, displacement of each chip C can be suppressed, so that rubbing of corners Cd of the adjacent chips C in or after dividing the wafer W in the grinding step can be suppressed to thereby prevent chipping of the corners Cd of each chip C.

Furthermore, in the wafer processing method according to the present invention, the first modified layer is formed in the modified layer forming step in such a manner that the first modified layer extending along each first street in the first direction is composed of the discontinuous first modified layer M11 and the discontinuous first modified layer M12, which are shifted from each other in the second direction. With this arrangement, the corners Cd of the diagonally adjacent chips C can be spaced from each other. Accordingly, rubbing of the corners Cd of the adjacent chips C in or after dividing the wafer W in the grinding step can be further suppressed to thereby further prevent chipping of the corners Cd of each chip C.

The wafer processing method according to the present invention is not limited to the above preferred embodiment. Further, the laser processing apparatus 1 and the grinding apparatus 2 are merely illustrative and they may be suitably changed in configuration or the like within the scope where the effects of the present invention can be exhibited.

For example, in the modified layer forming step, the laser beam may be first applied to the wafer W along each first street S1 to thereby form the first modified layer M11 and the first modified layer M12 along each first street S1. Thereafter, the laser beam may be applied to the wafer W along each second street S2 to thereby form the second modified layer M2 along each second street S2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a front side and a back side opposite the front side, the front side of said wafer being formed with a plurality of crossing streets for defining a plurality of separate regions where a plurality of devices are individually formed, said wafer processing method comprising:

a protective tape attaching step of attaching a protective tape to the front side of said wafer;

a heating step of heating said protective tape and said wafer after performing said protective tape attaching step;

a modified layer forming step of applying a laser beam having a transmission wavelength to said wafer to the back side of said wafer along said streets after performing said heating step, thereby forming a modified layer inside said wafer along each street; and a grinding step of grinding the back side of said wafer after performing said modified layer forming step, thereby reducing a thickness of said wafer to a predetermined thickness and also dividing said wafer into individual chips along each street where said modified layer is formed as a division start point;

wherein said plurality of streets are composed of a plurality of first streets extending in a first direction parallel to the front side of said wafer and a plurality of second streets extending in a second direction parallel to the front side of said wafer and intersecting said first direction, and said modified layer to be formed in said modified layer forming step includes a first modified layer extending along each first street and a second modified layer extending along each second street, and wherein said first modified layer is composed of a first group and a second group formed at a same predetermined depth from the back side of said wafer within each first street, said second group is shifted from said first group in said second direction and said second group and said first group do not overlap each other in the second direction in between any pair of adjacent second modified layers.

2. The wafer processing method according to claim 1, wherein said protective tape and said wafer are heated in said heating step by applying a hot plate on the back side of said wafer.

* * * * *